United States Patent [19]

Glenn

[11] Patent Number: 5,949,655
[45] Date of Patent: Sep. 7, 1999

[54] MOUNTING HAVING AN APERTURE COVER WITH ADHESIVE LOCKING FEATURE FOR FLIP CHIP OPTICAL INTEGRATED CIRCUIT DEVICE

[75] Inventor: Thomas P. Glenn, Gilbert, Ariz.

[73] Assignee: Amkor Technology, Inc., Chandler, Ariz.

[21] Appl. No.: 09/118,197

[22] Filed: Jul. 17, 1998

Related U.S. Application Data

[63] Continuation-in-part of application No. 08/926,495, Sep. 9, 1997, Pat. No. 5,867,368.

[51] Int. Cl.⁶ .................................................. H01L 31/0203
[52] U.S. Cl. ..................... 361/783; 361/820; 257/433; 257/434; 257/680; 257/681; 257/704; 438/116; 174/52.2; 174/52.3
[58] Field of Search ......................... 361/760–764, 361/783, 820; 257/431–434, 459, 680, 681, 684, 704; 174/52.1–52.6; 438/116; 348/374, 375; 396/542

[56] References Cited

U.S. PATENT DOCUMENTS

| | | | |
|---|---|---|---|
| 4,663,652 | 5/1987 | Nishizawa | 257/680 |
| 4,760,440 | 7/1988 | Bigler et al. | 257/680 |
| 4,833,102 | 5/1989 | Byrne et al. | 257/704 |
| 5,118,370 | 6/1992 | Ozawa | 156/73.1 |
| 5,200,631 | 4/1993 | Austin et al. | 257/433 |
| 5,239,131 | 8/1993 | Hoffman et al. | 174/52.4 |
| 5,331,512 | 7/1994 | Orton | 361/760 |
| 5,352,852 | 10/1994 | Chun | 174/52.4 |
| 5,357,056 | 10/1994 | Nagano | 257/680 |
| 5,387,815 | 2/1995 | Nishiguchi | 257/704 |
| 5,438,216 | 8/1995 | Juskey et al. | 257/434 |
| 5,478,007 | 12/1995 | Marrs | 228/180.22 |
| 5,495,450 | 2/1996 | Zollo et al. | 257/681 |
| 5,753,857 | 5/1998 | Choi | 174/52.4 |
| 5,786,589 | 7/1998 | Segawa et al. | 250/208.1 |
| 5,818,035 | 10/1998 | Krivanek et al. | 257/433 |

FOREIGN PATENT DOCUMENTS

| | | | |
|---|---|---|---|
| 0 562 550 A1 | 9/1993 | European Pat. Off. | |
| 52-10091 | 1/1977 | Japan | 257/434 |
| 55-62777 | 5/1980 | Japan | 257/680 |
| 02-77171 | 3/1990 | Japan | 257/434 |
| 02307250 | 12/1990 | Japan . | |

*Primary Examiner*—Leo P. Picard
*Assistant Examiner*—John B. Vigushin
*Attorney, Agent, or Firm*—Skjerven, Morrill, MacPherson, Franklin & Friel LLP; Alan H. MacPherson; James E. Parsons

[57] ABSTRACT

A mounting for a flip chip integrated circuit device having a light sensitive cell is disclosed. The mounting includes an insulating substrate having an aperture between its first and second surfaces. A flip chip integrated circuit device is placed on the first surface of the substrate. A light sensitive cell of the integrated circuit device faces the aperture. Solder bumps on the integrated circuit are electrically connected to corresponding conductive metallizations on the first surface of the substrate. A transparent aperture cover is affixed to the second surface of the substrate with an adhesive bead. The aperture cover extends over the aperture, allowing light to be transmitted through the aperture cover to the light sensitive cell. The side surfaces of the aperture cover include features for locking the adhesive bead to the aperture cover. The numerous locking features disclosed include protrusions and indentations that engage the adhesive bead and thereby enhance the connection of the aperture cover to the substrate.

19 Claims, 5 Drawing Sheets

MOUNTING HAVING AN APERTURE COVER WITH ADHESIVE LOCKING FEATURE FOR FLIP CHIP OPTICAL INTEGRATED CIRCUIT DEVICE

CROSS REFERENCE TO RELATED APPLICATION

This application is a continuation-in-part of Application Ser. No. 08/926,495, which was filed on Sep. 9, 1997 now U.S. Pat. No. 5,867,368.

FIELD OF THE INVENTION

The present invention relates to a mounting for electrically connecting a semiconductor integrated circuit device to a substrate using a flip chip attachment, in particular where the device is of a type which requires that light be transmitted onto a surface of the device.

BACKGROUND OF THE INVENTION

A known method of attaching a semiconductor integrated circuit device to a printed circuit board or other substrate is to use a flip chip attachment. Integrated circuit devices configured for flip chip attachment typically have a first surface which has a plurality of conductive bonding pads at its periphery. Bumps of metallic solder are formed on the bonding pads. The device is mounted with its first surface facing the substrate. The solder bumps are subsequently reflowed so that conductive metal-to-metal bonds are formed with mirror-image conductive metallizations on the circuit board or other substrate. Additional background information on flip chip attachment may be found in U.S. Pat. No. 5,478,007.

The use of a flip chip attachment between an integrated circuit device and a substrate has advantages, such as eliminating the need for bond wires and improving the electrical conduction between the between the integrated circuit device and the external metallization on the substrate.

Conventionally, certain types of integrated circuit devices are not mounted on substrates using a flip chip attachment. Such devices include charge coupled devices ("CCD"), erasable programmable read only memory ("EPROM") devices, and other light sensitive integrated circuit devices, such as those used in cameras, fingerprint recognition equipment, and scanners. These types of integrated circuit devices require a selected or continuous transmission of light onto a surface of the integrated circuit where light sensitive circuitry is located. Conventionally, this requirement precludes a flip chip attachment, because the light sensitive circuitry is typically on the same surface of the device as the bonding pads and the solder bumps. The light sensitive circuitry would face the substrate if a flip chip attachment were used, and thus light would not be directly incident on the light sensitive circuitry.

A mounting for connecting CCD, EPROM, or other optical integrated devices using a flip chip attachment would have wide application, because of the electrical advantages of lower capacitance, inductance, and resistance typically associated with a flip chip attachment.

SUMMARY OF INVENTION

Exemplary embodiments of a mounting for a semiconductor integrated circuit are described. The mounting accommodates integrated circuit devices, such as CCD, EPROM, and other devices, which require a selected or continuous application of light to a light-sensitive circuit, structure, or element on a surface of the device. The mounting employs a flip chip style of attachment.

The mounting includes an insulating substrate having an aperture between its first and second surfaces. As an example, the substrate may be a conventional printed circuit board. The aperture is preferably lined with an edge coating, such as an epoxy resin.

The integrated circuit device has a light sensitive circuit, structure, or element (hereinafter called a "light sensitive cell") on its first surface. The integrated circuit device also has conductive pads at the periphery of its first surface. The conductive pads are electrically connected to internal circuitry of the integrated circuit device. Conductive metallic solder bumps are formed on, and are electrically connected to, the conductive pads.

The integrated circuit device is mounted on the substrate so that its first surface is juxtaposed with and affixed to the first surface of the substrate. The light sensitive cell on the first surface of the integrated circuit device is aligned with and facing the aperture. The solder bumps are reflowed, and each becomes electrically connected to a corresponding conductive metallization, such as a metal trace or metal contact, on the first surface of the substrate. An adhesive underfill material, such as Hysol 4526, which is available from Dexter Corporation of City of Industry, Calif., forms a protective seal around the aperture between the integrated circuit device and the substrate, and between adjacent ones of the reflowed solder bumps.

The integrated circuit device may be enclosed above the first surface of the substrate. For example, the device may be encapsulated within an encapsulating material, such as Hysol 4450 by Dexter Corporation. Alternatively, the device may be enclosed in a preformed plastic, metal, or ceramic housing that is attached to the first surface of the substrate.

An aperture cover transparent to light of a selected frequency or selected range of frequencies is affixed to the second surface of the substrate. The aperture cover extends over the aperture and allows the transmission of light through the aperture to the light sensitive cell on the first surface of the integrated circuit device. An example aperture cover is a flat, square plate of borosilicate glass.

During assembly, a first surface of the aperture cover is placed onto and press-fitted into a bead of a viscous adhesive material, such as epoxy resin, that is applied onto the second surface of the substrate around the aperture. The bead attaches the first surface of the aperture cover to the first surface of the substrate around the aperture. The bead material also contacts and adheres to the peripheral side surfaces of the aperture cover. The bead provides a protective seal between the aperture cover and the second surface of the substrate.

In one embodiment, the peripheral side surfaces of the aperture cover are flat. In alternative embodiments, the peripheral side surfaces of the aperture cover have indented or outwardly protruding shapes. The adhesive bead material flows into the indentation, or onto the protrusion, resulting in a secure attachment between the adhesive bead and the aperture cover upon hardening of the adhesive bead.

The embodiments described herein allow integrated circuits devices to be mounted on a substrate using a flip chip attachment, while at the same time allowing light to be transmitted onto a light sensitive cell of the device facing the substrate. The flip chip attachment has cost advantages, such as eliminating the need for bond wires between the conductive pads of the integrated circuit device and metallizations on the substrate. There are also electrical conductivity advantages to a flip chip attachment, such as lower capacitance, inductance, and resistance, as compared to electrical connections using bond wires.

DETAILED DESCRIPTION

Figure 1:
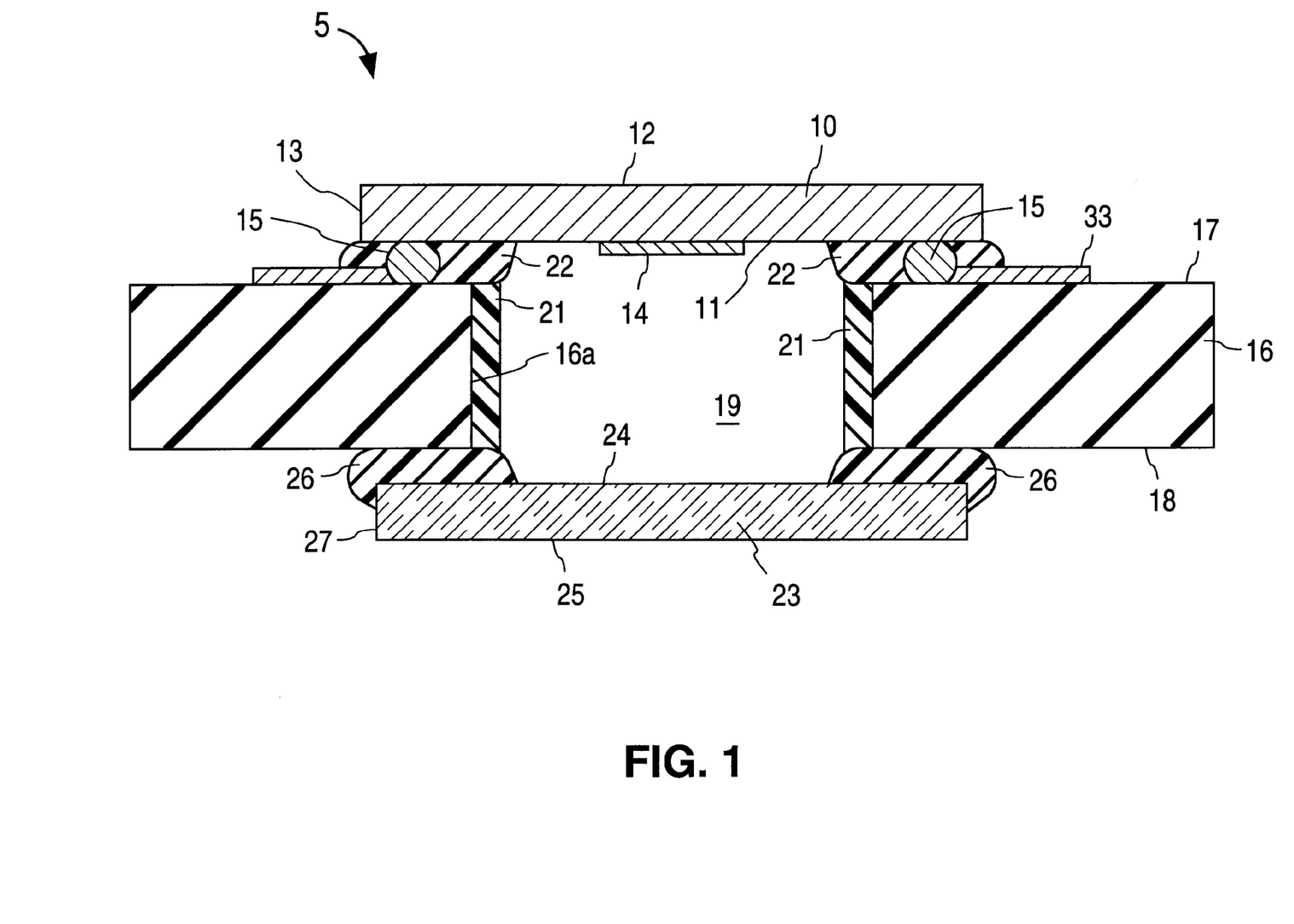
FIG. 1 is a cross-sectional side view of a mounting for a light sensitive integrated circuit device.

FIG. 1 shows a cross-sectional side view of an exemplary mounting 5 for a semiconductor integrated circuit device 10 having a light sensitive circuit, element, or structure on one of its surfaces. Examples of such devices are CCDs and EPROMs. The term "light sensitive cell" is used broadly herein to encompass the variety of forms that such light sensitive circuits, elements, or structures can take.

Integrated circuit device 10 has a first surface 11, a second surface 12 opposite first surface 11, and side surfaces 13 between the perimeters of first surface 11 and second surface 12. To exemplify the light sensitive cell described above, integrated circuit device 10 has a polyimide vision cell 14 centrally located on first surface 11 of integrated circuit device 10.

Figure 2:
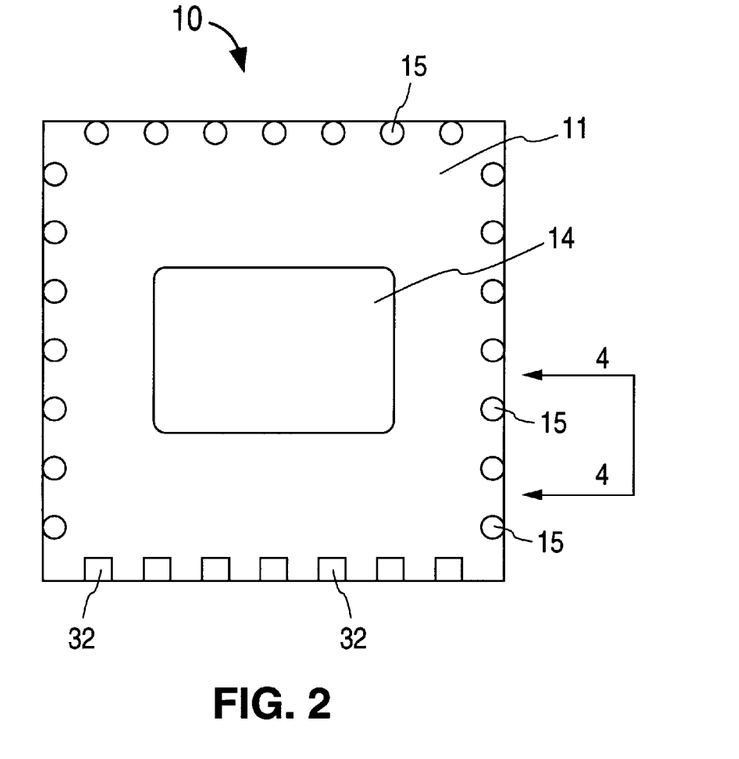
FIG. 2 is a plan view of a light sensitive integrated circuit device, before it is flipped and attached to a substrate, showing a light sensitive cell and solder bumps.

FIG. 2 is a plan view of integrated circuit device 10 before it is flipped and attached to a substrate. In this view, first surface 11 of integrated circuit device 10 is exposed. Vision cell 14 is at the approximate center of first surface 11. Numerous circular conductive metal solder bumps 15 are located on first surface 11 of integrated circuit device 10, along its perimeter. Solder bumps 15 are formed on conductive pads which are formed along the periphery of first surface 11 and are electrically connected to internal circuitry of integrated circuit device 10. For purposes of illustration, a row of several square conductive pads 32 is shown along one of the peripheral sides of first surface 11 of integrated circuit device 10. In actual construction, a solder bump 15 would be formed on each conductive pad 32.

Solder bumps 15 are conventional and may be formed, for example, of eutectic tin/lead solder. Conductive pads 32 are formed of metal, such as gold. The number and location of solder bumps 15, and their underlying conductive pads 32, on first surface 11 of integrated circuit device 10 can vary, depending on the application.

Adjacent to integrated circuit device 10 of FIG. 1 is an insulating substrate 16. Substrate 16 has a first surface 17 and an opposite second surface 18. In this example, substrate 11 is flat. Substrate 16 may be, for example, a printed circuit board formed of an epoxy laminate or ceramic material and having an exemplary thickness of from about 0.20 mm to about 1.0 mm.

Figure 3:
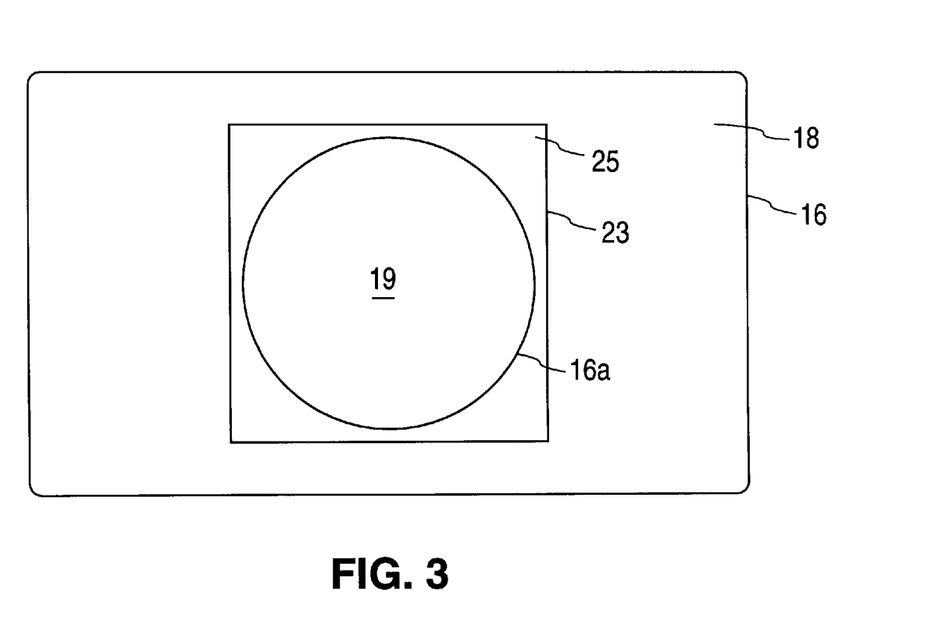
FIG. 3 is a plan view of a mounting showing a transparent aperture cover over an aperture through a substrate.

In FIG. 1, substrate 16 has an aperture 19 extending through it, from first surface 17 to second surface 18. In FIG. 3, aperture 19 is shown as having a circular perimeter beneath transparent aperture cover 23, but aperture 19 can have other shapes, such as square, depending on the application. Aperture 19 of FIG. 3 may be formed, for example, by lasering, mechanically drilling, or punching a circular hole through substrate 16.

The circular perimeter surface 16a of aperture 19 is lined with an edge coating to prevent fibers or particles of substrate 16 from flaking off onto first surface 11 of integrated circuit device 10 or first surface 24 of transparent aperture cover 23. Such loose particles could interfere with light transmission to the light sensitive cell(s) of integrated circuit device 10. This coating is shown as edge coat 21. Edge coat 21 may be, for example, a conventional epoxy resin material such as Hysol 4450, Hysol 4451, or Hysol 4323, which are available from the Dexter Corporation of City of Industry, Calif.

In FIG. 1, first surface 11 of integrated circuit device 10 is juxtaposed with and parallel to first surface 17 of substrate 16. The central part of first surface 11 of integrated circuit device 10, including vision cell 14, is aligned with and facing aperture 19.

During the assembly of mounting 5 of FIG. 1, after aperture 19 is formed and edge coat 21 is applied to perimeter surface 16a, integrated circuit device 10 is placed onto substrate 16 so that first surface 11 of device 10 is facing first surface 17 of substrate 16 and so that each solder bump 15 contacts a corresponding metallization 33 on first surface 17 of substrate 16. The conductive metallizations 33 on first surface 17 of substrate 16 may be, for example, metal traces or metal contacts formed of copper. After such placement, solid metal-to-metal conductive bonds are formed between each solder bump 15 and its counterpart metallization 33. Such bonds may be formed by a variety of conventional soldering methods, such as temporarily heating the metallizations or bumps so that solder bumps 15 reflow. The reflowed solder bumps 15 electrically connect integrated circuit device 10 to the metallizations 33 on first surface 17 of substrate 16.

After solder bumps 15 are soldered to their respective metallizations 33 on first surface 17 of substrate 16, a bead of a conventional viscous adhesive underfill material is placed onto first surface 17. The bead of underfill material is placed adjacent to solder bumps 15, on the side of solder bumps 15 laterally away from aperture 19. The underfill material wicks laterally inward between each reflowed solder bump 15 towards aperture 19 by capillary action. Subsequently, the underfill material is hardened, such as by a curing step, so that a solid protective seal of underfill material and reflowed solder bumps surrounds aperture 19 and connects first surface 11 of integrated circuit device 10 to first surface 17 of substrate 16. As an example of such a curing step, the underfill material may be cured by heating it to 150° C. for one hour. In FIG. 1, the solidified underfill material is denoted as underfill 22.

Figure 4:
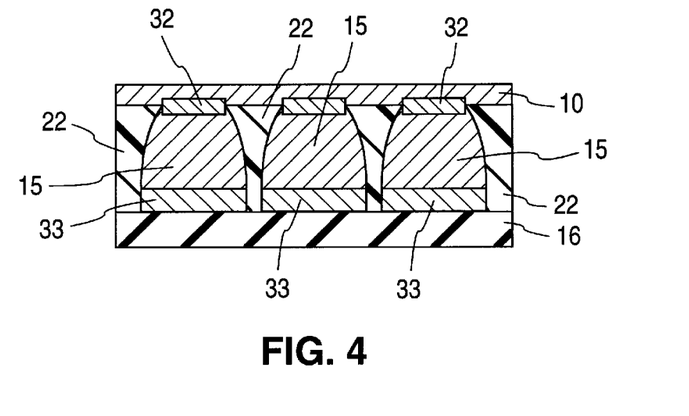
FIG. 4 is a partial cross-sectional side view of the mounting of FIG. 1 taken through the solder bumps along lines 4—4 of FIG. 2.

FIG. 4 is a partial cross sectional side view of mounting 5 of FIG. 1 taken through reflowed solder bumps 15 along lines 4—4 of FIG. 2. As shown in FIG. 4, solder bumps 15 provide an electrically conductive connection between conductive pads 32 of integrated circuit device 10 and corresponding metallizations 33 on first surface 17 of substrate 16. FIG. 4 also illustrates that the material of underfill 22 fills and seals the spaces between first surface 11 integrated circuit device 10, first surface 17 of substrate 16, and each reflowed solder bump 15.

As an example, underfill 22 may be formed of Hysol 4526, which is available from Dexter Corporation.

In FIG. 1, second surface 12 and side surfaces 13 of integrated circuit device 10 are exposed. In alternative embodiments, the exposed surfaces of integrated circuit device 10 above first surface 17 of substrate 16 may be enclosed.

Figure 5:
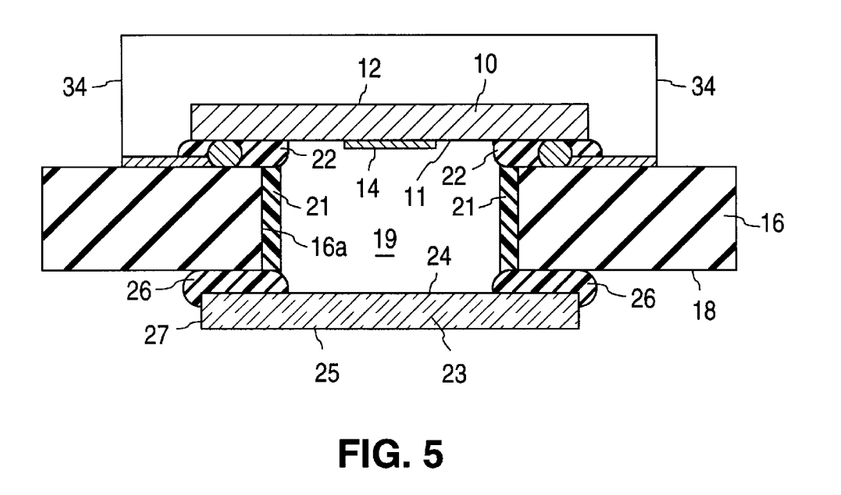
FIG. 5 is a cross-sectional side view of a mounting where the integrated circuit device is enclosed.

FIG. 5 shows an example enclosure 34 for enclosing device 10 above first surface 17 of substrate 16. Such enclosures may be used, for example, to provide protection for device 10. An enclosure 34 may be formed, for example, by applying a conventional adhesive encapsulating material onto and around integrated circuit device on and first surface 17 of substrate 16. An example encapsulating material is Hysol 4450, which is available from Dexter Corporation. Alternatively, an enclosure 34 may be formed by placing a pre-formed housing over device 10 and affixing such a housing to first surface 17 of substrate 16. The preformed housing may be made, for example, of plastic, metal, or ceramic.

Referring to FIG. 1, transparent aperture cover 23 is mounted on substrate 16. In particular, aperture cover 23 is adjacent to and extends over aperture 19 at the intersection of aperture 19 and second surface 18 of substrate 16. Both FIG. 1 and FIG. 3 show aperture cover 23 covering the entire area of aperture 19 at the intersection of aperture 19 and second surface 18 of substrate 16. Aperture cover 23 prevents dust and other undesirable material from contacting vision cell 14 of device 10.

Aperture cover 23 has a first surface 24 that is juxtaposed with second surface 18 of substrate 16, a second surface 25 opposite first surface 24, and a peripheral side surface 27 at the perimeter of aperture cover 23 between first surface 24 and second surface 25. In the example of FIG. 1, aperture cover 23 is flat in shape and is parallel to second surface 18 of substrate 16.

Aperture cover 23 is formed of a material that is transparent to the particular frequency or frequencies of light that must be provided to the light sensitive cell of integrated circuit device 10. In FIG. 1, such circuitry is exemplified by vision cell 14 on first surface 11 of device 10. As an example, aperture cover 23 may be a flat square plate of clear borosilicate glass having a thickness of about 0.5±0.05 mm.

In FIG. 1, a bead 26 of an adhesive material is between second surface 18 of substrate 16 and first surface 24 of aperture cover 23. Bead 26 affixes aperture cover 23 to second surface 18 of substrate 16, and seals out dust and other unwanted particles. Bead 26 contacts the periphery of first surface 24 of aperture cover 23 and part of side surface 27 of aperture cover 23. In alternative embodiments, bead 26 covers all of side surface 27 of aperture cover 23.

Bead 26 is formed of an adhesive material that is initially viscous, but is subsequently hardened to be solid. An example material for bead 26 is conventional epoxy resin, which may be hardened, for example, by heating the epoxy resin.

During one method of assembling mounting 5 of FIG. 1, after integrated circuit device 10 is mounted on first surface 17 of substrate 16, a viscous bead 26 is applied onto second surface 18 adjacent to and surrounding aperture 19. As a next step, transparent aperture cover 23 is placed symmetrically onto bead 26, centered over aperture 19, and is press-fitted into bead 26. Aperture cover 23 is positioned over aperture 19 so that light may be transmitted through aperture cover 23 and aperture 19 onto vision cell 14 of first surface 11 of integrated circuit device 10. A next step is to harden the material of bead 26, such as by heating, so that a permanent press-fitted interconnection is made between bead 26 and first surface 24 and side surface 27 of aperture cover 23. Aperture cover 23 may be placed onto bead 26 and secured by a spring clip (not shown) until bead 26 is hardened.

In an alternative assembly method, before bead 26 is applied onto second surface 18, the cavity formed by aperture 19 and first surface 11 of integrated circuit device 10 may be blown clean with an air jet.

In another alternative assembly method, a gap is left in bead 26 around aperture 19. After aperture cover 23 is placed and bead 26 is hardened, additional bead material is used to plug the gap in bead 26. The gap allows air to escape the cavity while bead 26 or other adhesive materials of mounting 5 harden. This step may assist in ensuring that the aperture cover is parallel to the substrate.

The sizes of the components of mounting 5 of FIG. 1 will vary, depending on the particular application. Considerations include the size of the integrated circuit device 10 that is mounted.

With reference to the embodiment of FIG. 1, the surface area of aperture cover 23 is selected so that aperture cover 23 extends over aperture 19 and also over an area of first surface 17 of substrate 16 around aperture 19 that is sufficient for aperture cover 23 to be affixed to first surface 17 by bead 26. In addition, the surface area of aperture cover 23 and the width and location of bead 26 are selected so that the material of bead 23 contacts side surface 27 of aperture cover 23 around the entire perimeter of aperture cover 23.

In FIG. 1, aperture cover 23 is shown as having a flat peripheral side surface 27 at the perimeter of aperture cover 23 between its first surface 24 and second surface 25. Side surface 27 has a perpendicular orientation relative to first surface 24 and second surface 25. In alternative embodiments, side surface 27 may be shaped to enhanced the attachment between bead 26 and aperture cover 23.

Figure 6:
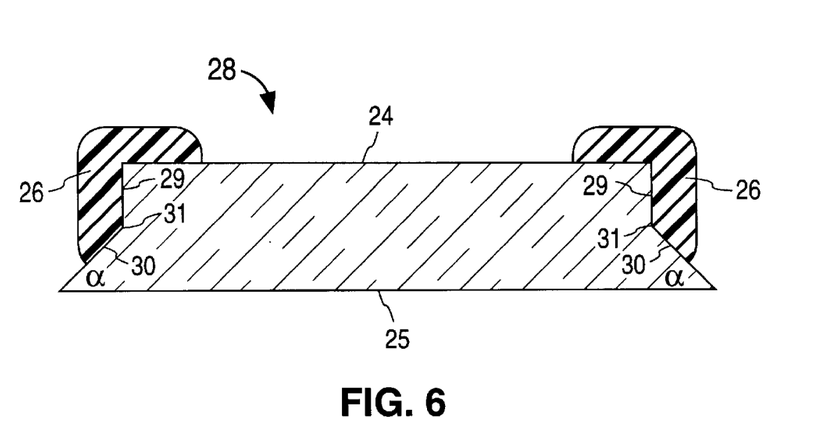
FIG. 6 is a cross-sectional side view of a aperture cover having a diagonal side surface portion and showing flowed bead material.

As an alternative to aperture cover 23 of FIG. 1, FIG. 6 shows a cross-sectional side view of an alternative aperture cover 28. Features of aperture cover 28 which are similar to features of aperture cover 23 of FIG. 1 have the same reference numbers. Unlike in FIG. 1, where peripheral side surface 27 of aperture cover 23 is flat and has a perpendicular orientation relative to first surface 24, the peripheral side surface of aperture cover 28 of FIG. 4 has a flat first side surface portion 29 and a diagonal second side surface portion 30. First side surface portion 29 extends from first surface 24 of aperture cover 28 to a point 31 located a distance, here shown as midway, between first surface 24 and second surface 25 of aperture cover 28. Second side surface portion 30 extends from point 31 to second surface 25 of aperture cover 28, and has a diagonal and laterally outward orientation relative to first surface 24 of cover 28 and to aperture 19 (FIG. 1). The diagonal angle α of second side surface portion 30 of cover 28 may be in the range of about 30 to 60 degrees, and is shown as being approximately 45 degrees.

When aperture cover 28 of FIG. 4 is pressed fitted into a viscous bead 26, the material of bead 26 contacts first side surface portion 29 and covers all or part of diagonal second side surface portion 30 of aperture cover 28. When hardened, the portion of bead 26 that covers diagonal second side surface portion 30 aids in securely affixing aperture cover 28 to substrate 16.

FIGS. 7–11 show alternatives to aperture cover 23 of FIG. 1. As in FIG. 6, the peripheral side surfaces of aperture covers 40, 44, 46, 50, and 53 of FIGS. 7–11, respectively, include locking features which enhance the adhesive connection between the aperture cover, bead 26, and second surface 18 of substrate 16, and thereby enhance the reliability of the mounting. These aperture covers may be formed, for example, of borosilicate glass or transparent plastic.

Figure 7:
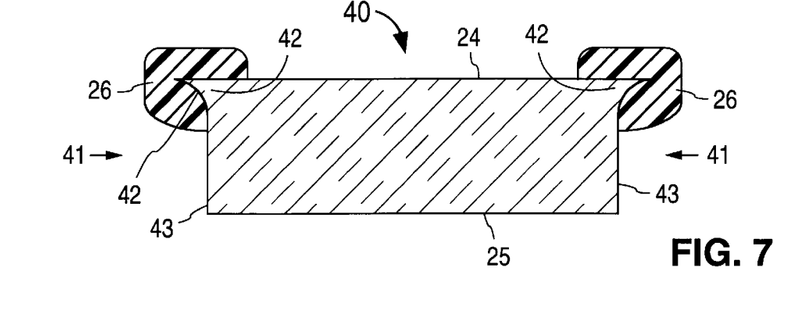
FIG. 7 is a cross-sectional side view of a aperture cover wherein the side surface of the aperture cover includes a protrusion having a concave surface.

Aperture cover 40 of FIG. 7 is like aperture cover 23 of FIG. 1, except that aperture cover 40 has a differently-shaped peripheral side surface. Aperture cover 40 of FIG. 7 has a substantially planar or planar first surface 24 and a substantially planar or planar opposite second surface 25. Side surface 41 is at the perimeter of aperture cover 40 between first surface 24 and second surface 25. In a completed mounting, first surface 24 of aperture cover 40 is juxtaposed with aperture 19 and second surface 18 of substrate 16 (not shown).

Side surface 41 of FIG. 7 includes a concave, protruding first portion 42, which is adjacent to first surface 24 of aperture cover 40, and an orthogonal second portion 43, which is adjacent to and between first portion 42 and second surface 25 of aperture cover 40. Side surface 41 may be formed by cutting aperture cover 40 from a sheet of glass or other aperture cover material using a rounded saw blade.

As shown in FIG. 7, adhesive bead material 26 covers a peripheral portion of first surface 24 of aperture cover 40 around aperture 19, and also covers all of first portion 42 and part of second portion 43 of side surface 41 around the entire perimeter of aperture cover 40. First portion 42 of side surface 41 protrudes into bead 26, and thereby enhances the connection between bead 26 and aperture cover 40. In alternative embodiments (not shown), bead 26 covers all of side surface 41.

Figure 8:
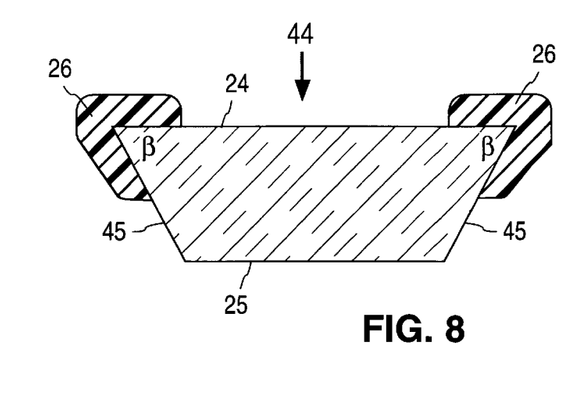
FIG. 8 is a cross-sectional side view of a aperture cover wherein the side surface of the aperture cover has a diagonal orientation relative to a planar first surface of the aperture cover.

In FIG. 8, aperture cover 44 includes a peripheral side surface 45 between first surface 24 and second surface 25. The area of first surface 24 is greater than the area of second surface 25. Side surface 45 of aperture cover 44 of FIG. 8 is entirely diagonal relative to first surface 24 of aperture cover 44, as opposed to the side surface of aperture cover 28 of FIG. 6, wherein only second portion 30 of the side surface of aperture cover 28 has a diagonal orientation. Beginning at first surface 24, side surface 45 of FIG. 8 slopes laterally inward relative to first surface 24 of aperture cover 44 and aperture 19 (FIG. 1). The slope of side surface 45 may vary. An example range of slopes for angle β of side surface 45 of aperture cover 44 is about 30 to 75 degrees, e.g., 45 degrees. Side surface 45 may be formed by cutting aperture cover 44 from a sheet of glass or other aperture cover material using a wedge-shaped saw blade.

Referring to FIG. 8, bead material 26 on second surface 18 of substrate 16 (not shown) covers a portion of diagonal side surface 45 adjacent to first surface 24 of aperture cover 44, although in alternative embodiments, all of side surface 45 may be covered by bead 26.

Figure 9:
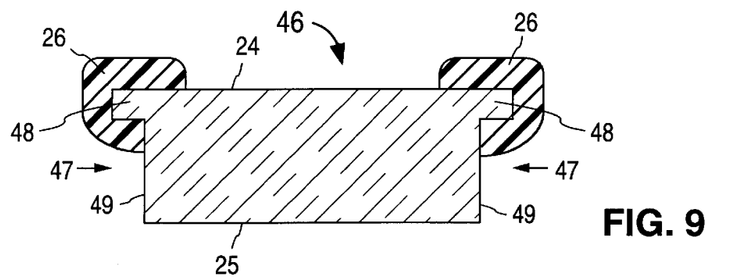
FIG. 9 is a cross-sectional side view of a aperture cover wherein the side surface of the aperture cover includes a recessed orthogonal portion.

In FIG. 9, aperture cover 46 includes a peripheral side surface 47 between first surface 24 and second surface 25 of aperture cover 46. Side surface 47 of aperture cover 46 includes a protruding rectangular lip. In particular, side surface 47 includes an orthogonal first portion 48, which is adjacent to first surface 24, and a recessed orthogonal second portion 49, which is adjacent to and between first portion 48 and second surface 25 of aperture cover 46. Bead material 26 covers all of first portion 48 and part of recessed second portion 49 of side surface 47, although in alternative embodiments, all of side surface 47 may be covered by bead 26. Side surface 47 may be formed using a step cut saw blade.

Figure 10:
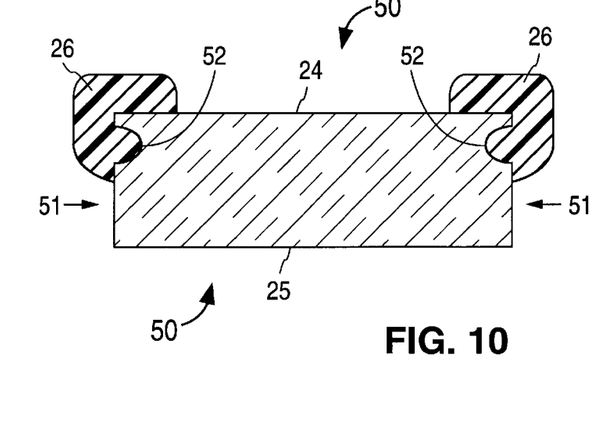
FIG. 10 is a cross-sectional side view of a aperture cover wherein the side surface of the aperture cover includes an arc-shaped indentation.

In FIG. 10, aperture cover 50 includes a peripheral side surface 51 between first surface 24 and second surface 25 of aperture cover 50. Side surface 51 of aperture cover 50 includes an arc-shaped indentation 52. Indentation 52 is closer to first surface 24 of aperture cover 50 than to second surface 25. The remainder of side surface 51 is orthogonal. Bead material 26 flows into indentation 52, locking bead 26 to cover 50. Bead 26 also covers part of the orthogonal portion of side surface 51 on both sides of indentation 52, although in alternative embodiments, all of side surface 51 may be covered by bead 26. Indentation 52 may be formed with a rounded saw blade.

Figure 11:
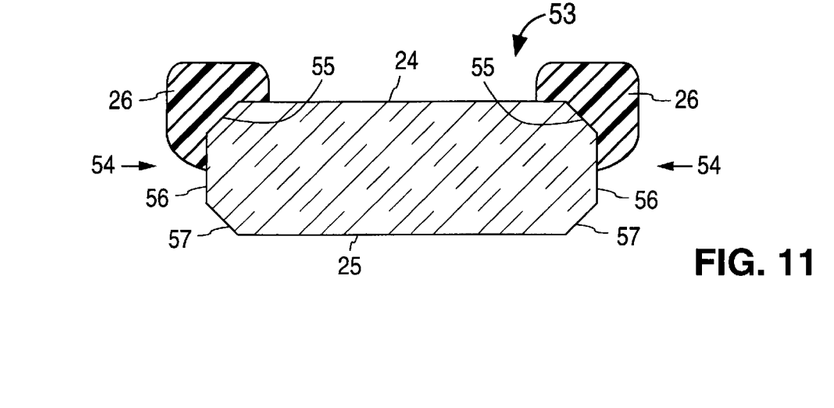
FIG. 11 is a cross-sectional side view of a aperture cover wherein the side surface of the aperture cover includes diagonal portions where the corners of the side surface are removed.

In FIG. 11, aperture cover 53 includes a peripheral side surface 54 between first surface 24 and second surface 25 of aperture cover 53. Side surface 54 of aperture cover 53 includes a diagonal first portion 55, which is adjacent to first surface 24; an orthogonal second portion 56, which is adjacent to and between first portion 55 and second surface 25 of aperture cover 53; and a diagonal third portion 57, which is adjacent to and between second portion 56 and second surface 25 of aperture cover 53.

Beginning at first surface 24, first portion 55 of side surface 54 slopes laterally outward relative to first surface 24 of aperture cover 53 and aperture 19 (FIG. 1). Third portion 57 of side surface 54 is oppositely sloped. Third portion 57 slopes laterally inward relative to first surface 24 of aperture cover 53 and aperture 19 (FIG. 1). In addition, although not shown, first portion 55 and third portion 57 have an abraded surface. The abraded surface may be formed with a saw blade, and the abrasions may be saw marks.

Bead material 26 of FIG. 11 covers all of first portion 55 of side surface 54, and a portion of orthogonal second portion 56 of side surface 54, although in alternative embodiments, all of side surface 47 may be covered by bead 26. The diagonal and roughly-textured surfaces of first portion 55 and third portion 57 of side surface 54 enhance the adhesion of bead material 26 to aperture cover 53, and thus enhance the connection between aperture cover 53 and substrate 16.

FIGS. 12–15 show alternative embodiments of aperture covers. Like aperture cover 23 of FIG. 1, the aperture covers of FIGS. 12–15 have orthogonal peripheral side surfaces 27. However, changes are made to first surface 24 of the aperture covers in order to enhance the adhesive connection between the aperture cover and second surface 18 of substrate 16. First surface 24 is juxtaposed with second surface 18 and aperture 19 of substrate 16.

Figure 13:
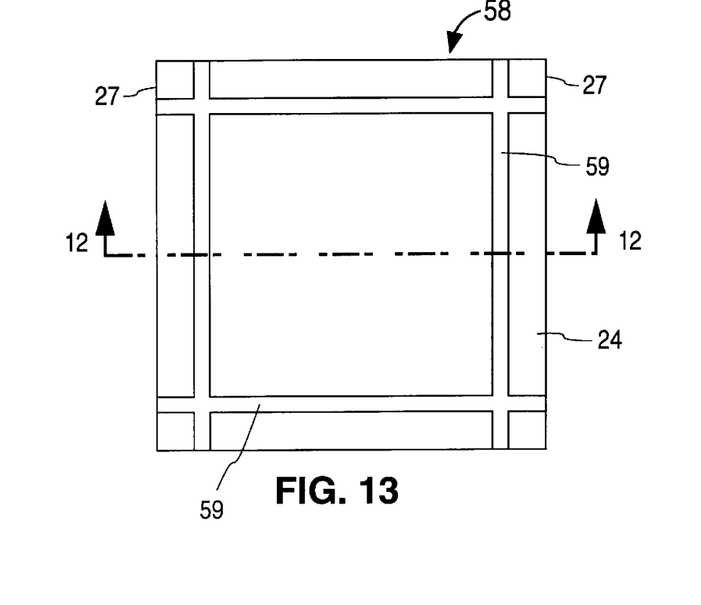
FIG. 13 is a plan view of the aperture cover of FIG. 12.

FIG. 13 is a plan view of a first surface 24 of an aperture cover 58. Four rectilinear, intersecting grooves 59 are formed in first surface 24 of aperture cover 58. The four grooves 59 form a contiguous rectangle around aperture 19 (not shown).

Grooves 59 are located close to the perimeter of cover 58. In particular, groove 59 is located in a portion of first surface 24 of aperture cover 58 that is juxtaposed with second surface 18 of substrate 16.

Figure 12:
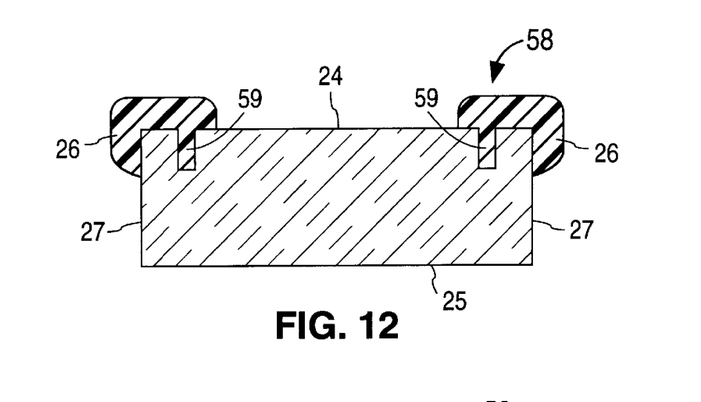
FIG. 12 is a cross-sectional side view of an aperture cover taken on the line 12—12 of FIG. 13 wherein a groove is cut into a first surface of the aperture cover and adhesive material fills the groove.

FIG. 12 is a cross-sectional side view of aperture cover 58 of FIG. 13 along line 12—12. The cross-sectional shape of groove 59 is rectangular, and may be formed with a saw blade. An example depth of groove 59 is about 0.1 mm in a lid that is 0.5 mm thick.

Referring to FIG. 12, bead material 26 on second surface 18 of substrate 16 flows into groove 59, which helps to lock bead 26 to aperture cover 58, and thereby enhances the connection of aperture cover 58 to substrate 16. Bead 26 also contacts a portion of side surface 27 of aperture cover 58, although in alternative embodiments, bead 26 may contact all or none of side surface 27.

Figure 14:
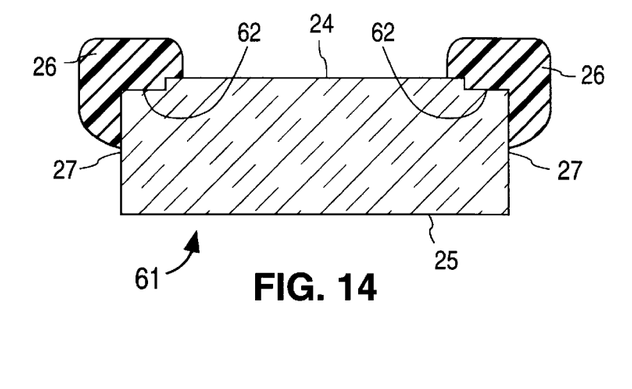
FIG. 14 is a cross-sectional side view of an aperture cover taken on the line 14—14 of FIG. 15 wherein a peripheral portion of the first surface of the aperture cover has an abraded surface and adhesive material covers the abraded surface.
Figure 15:
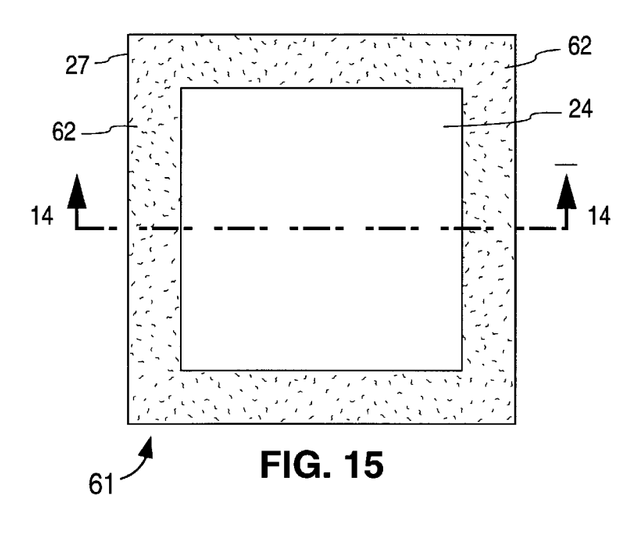
FIG. 15 is a plan view of the aperture cover of FIG. 14.

FIG. 14 is a cross-sectional side view of an aperture cover 61. FIG. 15 is a plan view of a first surface 24 of aperture cover 61 of FIG. 14. The view of FIG. 14 was taken along line 14—14 of FIG. 15.

As shown in FIG. 14, an abraded surface 62 is provided at the perimeter of first surface 24 of aperture cover 61. As shown in FIG. 15, abraded surface 62 is formed around the entire rectangular perimeter of first surface 24. Such an abraded surface may be formed by sandblasting a peripheral portion of first surface 24. Accordingly, abraded surface 62 may be slightly indented on average and include scratches, small indentations, ridges, and other features typical of a sand-blasted or otherwise abraded surface.

As shown in FIG. 14, bead material 26 covers abraded surface 62. The interaction of bead 26 and abraded surface 62 locks bead 26 to aperture cover 61, and thereby enhances the connection of cover 61 to substrate 16. Bead 26 also contacts a portion of side surface 27 of aperture cover 61, although in alternative embodiments, bead 26 may contact all or none of side surface 27.

In addition to enhanced reliability, another benefit of the aperture cover locking features of the present invention (e.g., FIGS. 6–15) is that the aperture cover can be efficiently sized, so that only a small peripheral portion of the aperture cover is in contact with the bead 26 around aperture 19. In other words, because of the bead locking features of the aperture covers, less of the area of the aperture cover needs to be affixed by bead 26 to second surface 18 of substrate 16. For example, only about 0.125 mm or less of the outer peripheral portion of first surface 24 of the aperture cover (measured inward from perimeter of first surface 24) needs to be in contact with bead 26 around aperture 19. The aperture covers of the present invention may be 50% smaller in area than conventional aperture covers.

The embodiments described herein are merely examples of the present invention. Artisans will appreciate that variations are possible within the scope of the claims. For example, for added strength in the attachment of the aperture cover to the substrate, the embodiments of FIGS. 6–11 may be combined, with minor adjustments, on an aperture cover with the embodiments of FIGS. 12–15.

I claim:

1. A mounting for an integrated circuit device comprising:
   an insulating substrate having a first surface, an opposite second surface, and an aperture through the substrate between the first and second surfaces, said first surface including conductive metallization;
   an integrated circuit device having a first surface, wherein the first surface of the integrated circuit device has a plurality of conductive pads thereon and a light sensitive cell; and
   a transparent aperture cover, said aperture cover having a first surface, an opposite second surface, and a side surface between the first and second surfaces, wherein the first surface of the aperture cover is juxtaposed to the second surface of the substrate, the aperture cover is over the aperture, and the side surface of the aperture cover includes a protruding portion having a concave surface portion;
   wherein the first surface of the integrated circuit device faces and is affixed to the first surface of the substrate, the light sensitive cell is aligned with the aperture, the aperture cover transmits light to the light sensitive cell through the aperture, and the conductive pads of the integrated circuit device are electrically connected to the conductive metallization on the first surface of the substrate; and
   a first adhesive material affixing the first surface aperture cover to the second surface of the substrate around the aperture, wherein said first adhesive material covers the protruding concave portion of the side surface of the aperture cover.

2. The mounting of claim 1, wherein the protruding portion of the side surface of the aperture cover is adjacent to the first surface of the aperture cover.

3. The mounting of claim 2, wherein the first adhesive material covers the entire side surface of the aperture cover.

4. A mounting for an integrated circuit device comprising:
   an insulating substrate having a first surface, an opposite second surface, and an aperture through the substrate between the first and second surfaces, said first surface including conductive metallization;
   an integrated circuit device having a first surface, wherein the first surface of the integrated circuit device has a plurality of conductive pads thereon and a light sensitive cell; and
   a transparent aperture cover, said aperture cover having a first surface, an opposite second surface, and a side surface between the first and second surfaces;
   wherein the first surface of the aperture cover is juxtaposed to the second surface of the substrate, the aperture cover is over the aperture, and the side surface of the aperture cover includes first portion having a laterally inward diagonal orientation relative to the first surface of the aperture cover and the aperture;
   wherein the first surface of the integrated circuit device faces and is affixed to the first surface of the substrate, the light sensitive cell is aligned with the aperture, the aperture cover transmits light to the light sensitive cell through the aperture, and the conductive pads of the integrated circuit device are electrically connected to the conductive metallization on the first surface of the substrate; and a first adhesive material affixing the first surface of the aperture cover to the second surface of the substrate around the aperture, said first adhesive material covering the first portion of the side surface of the aperture cover.

5. The mounting of claim 4, wherein the entire side surface of the aperture cover has said diagonal orientation.

6. The mounting of claim 4, wherein the first adhesive material covers the entire side surface of the aperture cover.

7. A mounting for an integrated circuit device comprising:

an insulating substrate having a first surface, an opposite second surface, and an aperture through the substrate between the first and second surfaces, said first surface including conductive metallization;

an integrated circuit device having a first surface, wherein the first surface of the integrated circuit device has a plurality of conductive pads thereon and a light sensitive cell; and a transparent aperture cover, said aperture cover having a first surface, an opposite second surface, and a side surface between the first and second surfaces, wherein the first surface of the aperture cover is juxtaposed to the second surface of the substrate, and the aperture cover is over the aperture;

wherein the side surface of the aperture cover includes a first orthogonal portion and a second orthogonal portion, said second orthogonal portion being recessed from said first orthogonal portion;

wherein the first surface of the integrated circuit device faces and is affixed to the first surface of the substrate, the light sensitive cell is aligned with the aperture, the aperture cover transmits light to the light sensitive cell through the aperture, and the conductive pads of the integrated circuit device are electrically connected to the conductive metallization on the first surface of the substrate; and a first adhesive material affixing the first surface of the aperture cover to the second surface of the substrate around the aperture, said first adhesive material covering said first orthogonal portion of the side surface of the aperture cover and a portion of said second orthogonal portion of the side surface of the aperture cover.

8. The mounting of claim 7, wherein said first orthogonal portion of the side surface of the aperture cover is adjacent to the first surface of the aperture cover.

9. The mounting of claim 7, wherein the first adhesive material covers the entire side surface of the aperture cover.

10. A mounting for an integrated circuit device comprising:

an insulating substrate having a first surface, an opposite second surface, and an aperture through the substrate between the first and second surfaces, said first surface including conductive metallization;

an integrated circuit device having a first surface, wherein the first surface of the integrated circuit device has a plurality of conductive pads thereon and a light sensitive cell; and a transparent aperture cover, said aperture cover having a first surface, an opposite second surface, and a side surface between the first and second surfaces, wherein the first surface of the aperture cover is juxtaposed to the second surface of the substrate, and the aperture cover is over the aperture;

wherein the side surface of the aperture cover includes a first portion adjacent to the first surface of the aperture cover, a second portion adjacent to said first portion, and a third portion adjacent to said second portion, said first portion having a laterally outward diagonal orientation relative to the first surface of the aperture cover and the aperture, said second portion having a perpendicular orientation relative to the first surface of the aperture cover, and said third portion having a laterally inward diagonal orientation relative to the first surface of the aperture cover and the aperture;

wherein the first surface of the integrated circuit device faces and is affixed to the first surface of the substrate, the light sensitive cell is aligned with the aperture, the aperture cover transmits light to the light sensitive cell through the aperture, and the conductive pads of the integrated circuit device are electrically connected to the conductive metallization on the first surface of the substrate; and a first adhesive material affixing the first surface of the aperture cover to the second surface of the substrate around the aperture, said first adhesive material covering said first portion of the side surface of the aperture cover and part of said second portion the side surface of the aperture cover.

11. The mounting of claim 10, wherein the first portion of the side surface of the aperture cover has an abraded surface.

12. The mounting of claim 10, wherein the first adhesive material covers the entire side surface of the aperture cover.

13. A mounting for an integrated circuit device comprising:

an insulating substrate having a first surface, an opposite second surface, and an aperture through the substrate between the first and second surfaces, said first surface including conductive metallization;

an integrated circuit device having a first surface, wherein the first surface of the integrated circuit device has a plurality of conductive pads thereon and a light sensitive cell; and a transparent aperture cover having a first surface with an indentation therein;

wherein the first surface of the integrated circuit device faces and is affixed to the first surface of the substrate, the light sensitive cell is aligned with the aperture, and the conductive pads of the integrated circuit device are electrically connected to the conductive metallization on the first surface of the substrate; and a first adhesive material affixing the first surface of the aperture cover to the second surface of the substrate around the aperture so that the aperture cover transmits light to the light sensitive cell through the aperture, and wherein said first adhesive material fills the indentation in the first surface of the aperture cover.

14. The mounting of claim 13, wherein the indentation is contiguous around the aperture.

15. The mounting of claim 14, wherein the indentation is a groove.

16. A mounting for an integrated circuit device comprising:

an insulating substrate having a first surface, an opposite second surface, and an aperture through the substrate between the first and second surfaces, said first surface including conductive metallization;

an integrated circuit device having a first surface, wherein the first surface of the integrated circuit device has a plurality of conductive pads thereon and a light sensitive cell; and a transparent aperture cover having a first surface, said first surface having a perimeter and an abraded portion adjacent to said entire perimeter;

wherein the first surface of the integrated circuit device faces and is affixed to the first surface of the substrate, the light sensitive cell is aligned with the aperture, and the conductive pads of the integrated circuit device are electrically connected to the conductive metallization on the first surface of the substrate; and a first adhesive material affixing the first surface of the aperture cover to the second surface of the substrate around the aperture so that the aperture cover transmits light to the light sensitive cell through the aperture, and wherein said first adhesive material covers the abraded portion of the first surface of the aperture cover.

17. A mounting for an integrated circuit device comprising:

an insulating substrate having a first surface, an opposite second surface, and an aperture through the substrate between the first and second surfaces, said first surface including conductive metallization;

an integrated circuit device having a first surface, wherein the first surface of the integrated circuit device has a plurality of conductive pads thereon and a light sensitive cell; and a transparent aperture cover having first surface;

wherein the first surface of the integrated circuit device faces and is affixed to the first surface of the substrate, the light sensitive cell is aligned with the aperture, and the conductive pads of the integrated circuit device are electrically connected to the conductive metallization on the first surface of the substrate; and a first adhesive material affixing the first surface of the aperture cover to the second surface of the substrate around the aperture so that the aperture cover transmits light to the light sensitive cell through the aperture; and wherein said first surface of the aperture cover includes a means for enhancing a connection between said first adhesive material and said aperture cover.

18. The mounting of claim 17, wherein said aperture cover includes a side surface adjacent to said first surface, and said side surface includes a means for enhancing a connection between said first adhesive material and said aperture cover.

19. A mounting for an integrated circuit device comprising:

an insulating substrate having a first surface, an opposite second surface, and an aperture through the substrate between the first and second surfaces, said first surface including conductive metallization;

an integrated circuit device having a first surface, wherein the first surface of the integrated circuit device has a plurality of conductive pads thereon and a light sensitive cell; and a transparent aperture cover having first surface;

wherein the first surface of the integrated circuit device faces and is affixed to the first surface of the substrate, the light sensitive cell is aligned with the aperture, and the conductive pads of the integrated circuit device are electrically connected to the conductive metallization on the first surface of the substrate; and a first adhesive material affixing the first surface of the aperture cover to the second surface of the substrate around the aperture so that the aperture cover transmits light to the light sensitive cell through the aperture;

wherein said aperture cover includes a side surface adjacent to said first surface, and said side surface includes a means for enhancing a connection between said first adhesive material and said aperture cover; and wherein said means and only about 0.125 mm or less of a peripheral portion of the first surface of the aperture cover are in contact with said first adhesive material.

* * * * *